(12) United States Patent
Burdick, Jr. et al.

(10) Patent No.: US 7,982,570 B2
(45) Date of Patent: Jul. 19, 2011

(54) HIGH PERFORMANCE LOW VOLUME INDUCTOR AND METHOD OF MAKING SAME

(75) Inventors: William E. Burdick, Jr., Niskayuna, NY (US); Ji-Ung Lee, Niskayuna, NY (US); Michael A. de Rooij, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 1177 days.

(21) Appl. No.: 11/557,193

(22) Filed: Nov. 7, 2006

(65) Prior Publication Data

US 2008/0122439 A1    May 29, 2008

(51) Int. Cl.
*H01F 5/00* (2006.01)
(52) U.S. Cl. ........................................................ 336/200
(58) Field of Classification Search .................. 336/200, 336/232; 257/531
See application file for complete search history.

(56) References Cited

U.S. PATENT DOCUMENTS

| | | | |
|---|---|---|---|
| 6,784,779 B2 * | 8/2004 | Shin et al. ...................... 336/200 |
| 2006/0283262 A1 * | 12/2006 | Smits et al. ...................... 73/799 |
| 2007/0085544 A1 * | 4/2007 | Viswanathan ................ 324/318 |
| 2008/0068013 A1 * | 3/2008 | Viswanathan ................ 324/309 |
| 2008/0136551 A1 * | 6/2008 | Phillips ........................... 333/32 |

OTHER PUBLICATIONS

Philip G. Collins and Phaedon Avouris, "Nanotubes for Electronics," Scientific American, Dec. 2000.
Phaedon Avouris, "Molecular Electronics with Carbon Nanotubes," Accounts of Chemical Research, vol. 35, No. 12, 2002.

* cited by examiner

*Primary Examiner* — Tuyen Nguyen
(74) *Attorney, Agent, or Firm* — Scott J. Asmus

(57) ABSTRACT

An inductor includes an electrical conductor wound in a magnetic flux concentrating pattern, the electrical conductor comprises a plurality of carbon nanotubes that are substantially aligned with an axis along a center of the electrical conductor.

17 Claims, 7 Drawing Sheets

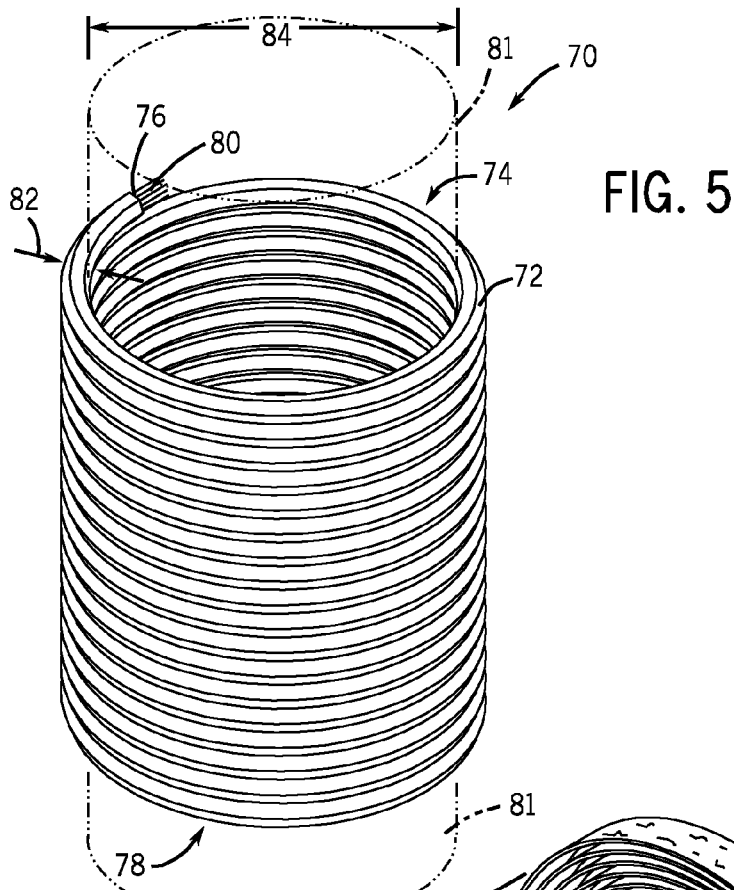
FIG. 5
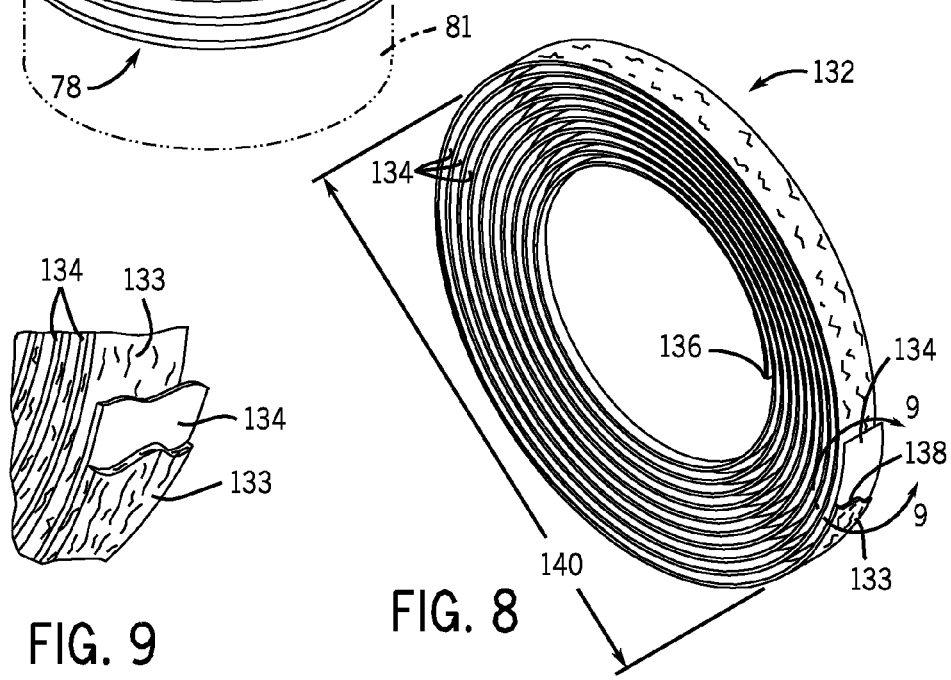
FIG. 9
FIG. 8

HIGH PERFORMANCE LOW VOLUME INDUCTOR AND METHOD OF MAKING SAME

BACKGROUND OF THE INVENTION

The present invention relates generally to inductors, and, more specifically, to a high performance inductor incorporating carbon nanotubes in its construction.

When a substance such as human tissue is subjected to a uniform magnetic field (polarizing field $B_0$), the individual magnetic moments of the spins in the tissue attempt to align with this polarizing field, but process about it, in random order, at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MR receiver coils receive the emitted signals and use the acquired signals for image reconstruction. The MR receiver coils typically use individual passive elements such as inductors in their RF circuitry. However, existing inductor constructions are often too large, in area and volume, to incorporate into high channel count of small designs where miniaturization is desired.

Carbon nanotubes have been developed in recent years and show promise for a multitude of products because of their unique properties. Among the properties is a high electrical conductivity thereby enabling the carbon nanotube to carry a very high electrical current density. Current carrying capabilities of bulk carbon nanotubes typically exceeds that of copper by 2.5 to 6 times. Additionally, carbon nanotubes exhibit high thermal conductivity, up to for instance 4000-6000 W/m-K.

Inductors are typically constructed with an electrically conducting material, such as copper, formed in a magnetic flux-concentrating pattern such as a coil. Typically, the electrically conducting material is wrapped about a core such as air or a ferromagnetic material. When electrical current is passed through the conductor, a magnetic field is induced about the conductor and core. The coil arrangement concentrates the induced magnetic field, thereby creating an inductance, L. A time-varying current, $$\frac{di(t)}{dt},$$

passing through the conductor will cause a time-varying voltage, v(t), across the inductor, as described by the following differential equation:

$$v(t) = L\frac{di(t)}{dt}. \qquad \text{(Eqn. 1)}$$

The Q factor quantifies the performance of an inductor in an electrical circuit:

$$Q = \frac{wL}{R}. \qquad \text{(Eqn. 2)}$$

As such, loss of inductive quality occurs when resistance of the electrical conductor is increased or when inductance, L, is decreased. Reduced Q factor thereby causes reduced performance of an electrical circuit, and in particular, an electrical circuit in a RF receiver coil of a MR system. Additionally, use of a ferromagnetic core material in an inductor is not compatible with use in an MR system. Increasingly, there is a demand for inductors in RF circuits with both improved Q factor and reduced area and volume.

It would therefore be desirable to have an inductor with increased Q factor, while also obtaining such performance improvement with reduced area and volume.

BRIEF DESCRIPTION OF THE INVENTION

The present invention provides an improved inductor for an RF electrical circuit that overcomes the aforementioned drawbacks. An inductor constructed with carbon nanotubes benefits from an increased Q factor at a reduced area and volume.

In accordance with one aspect of the invention, an inductor comprises an electrical conductor wound in a magnetic flux concentrating pattern, the electrical conductor comprising a plurality of carbon nanotubes substantially aligned with an axis along a center of the electrical conductor.

Another embodiment of the present invention is directed to a method of fabricating an inductor that includes the steps of providing a plurality of threadlike molecules substantially axially aligned along a common axis, and winding the plurality of carbon nanotubes in a magnetic flux concentrating pattern.

Yet another embodiment of the present invention is directed to an MRI apparatus that includes a magnetic resonance imaging (MRI) system having a plurality of gradient coils positioned about a bore of a magnet. The gradient coils impress spatially dependent changes to a polarizing magnetic field, and an RF transceiver system and an RF switch are controlled by a pulse module to collect RF signals from an array of RF receive coils to acquire MR images. A plurality of carbon nanotube inductors are electrically connected to the array of RF receive coils. Each carbon nanotube inductor is wound in a pattern to concentrate magnetic flux and comprises a plurality of carbon nanotubes substantially aligned with each other.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 5 shows a coil inductor in accordance with an embodiment of the present invention.

FIG. 8 shows a rolled design of an inductor in accordance with an embodiment of the present invention.

FIG. 9 shows a cutaway view of the inductor of FIG. 8 mounted on a substrate.

DETAILED DESCRIPTION OF THE PREFERRED EMBODIMENT

Figure 1:
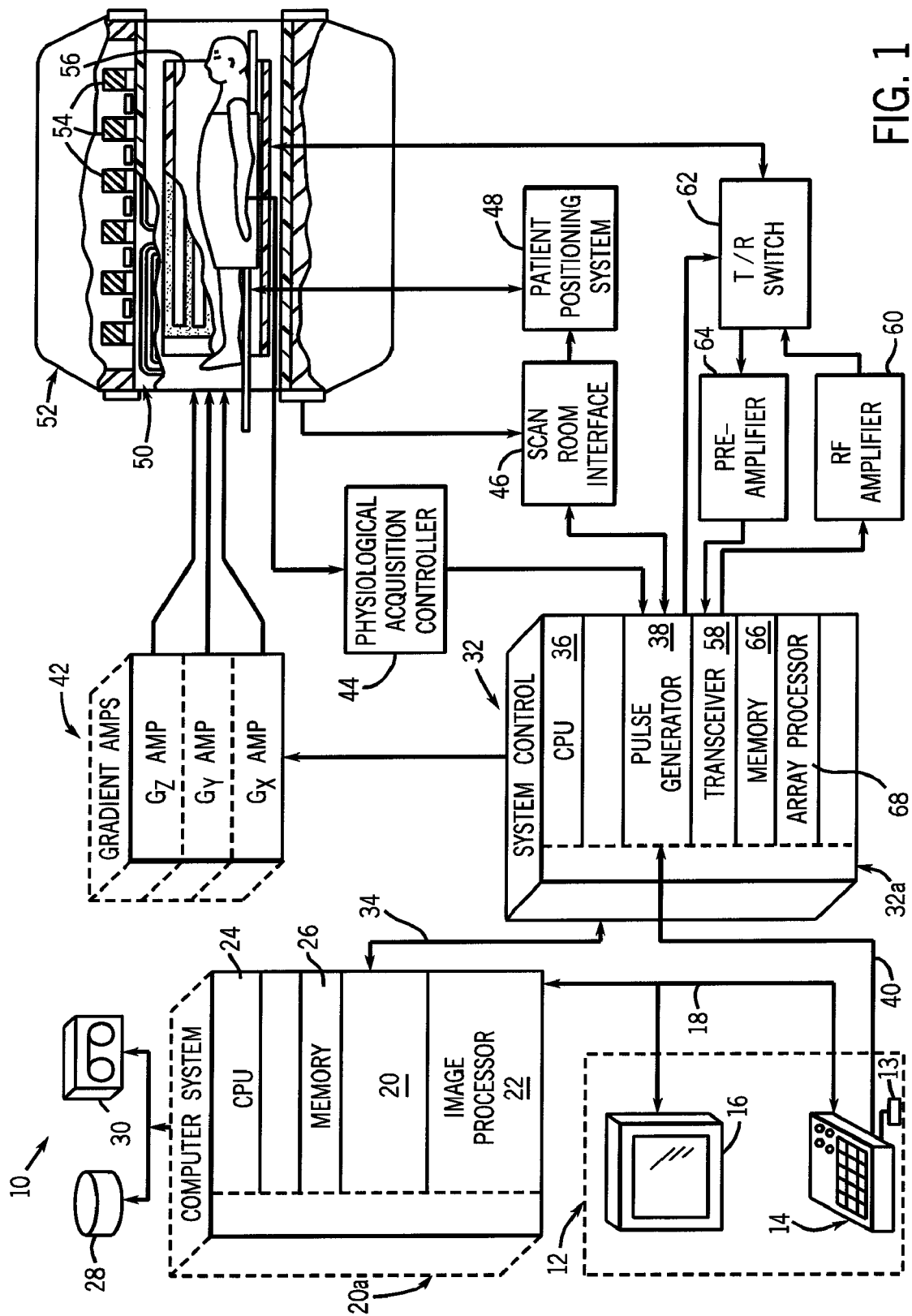
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 or may by sensed by a separate receiver coil system comprising an array of multiple receive coils that are embedded into a structure that is worn by the patient. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

Figure 2:
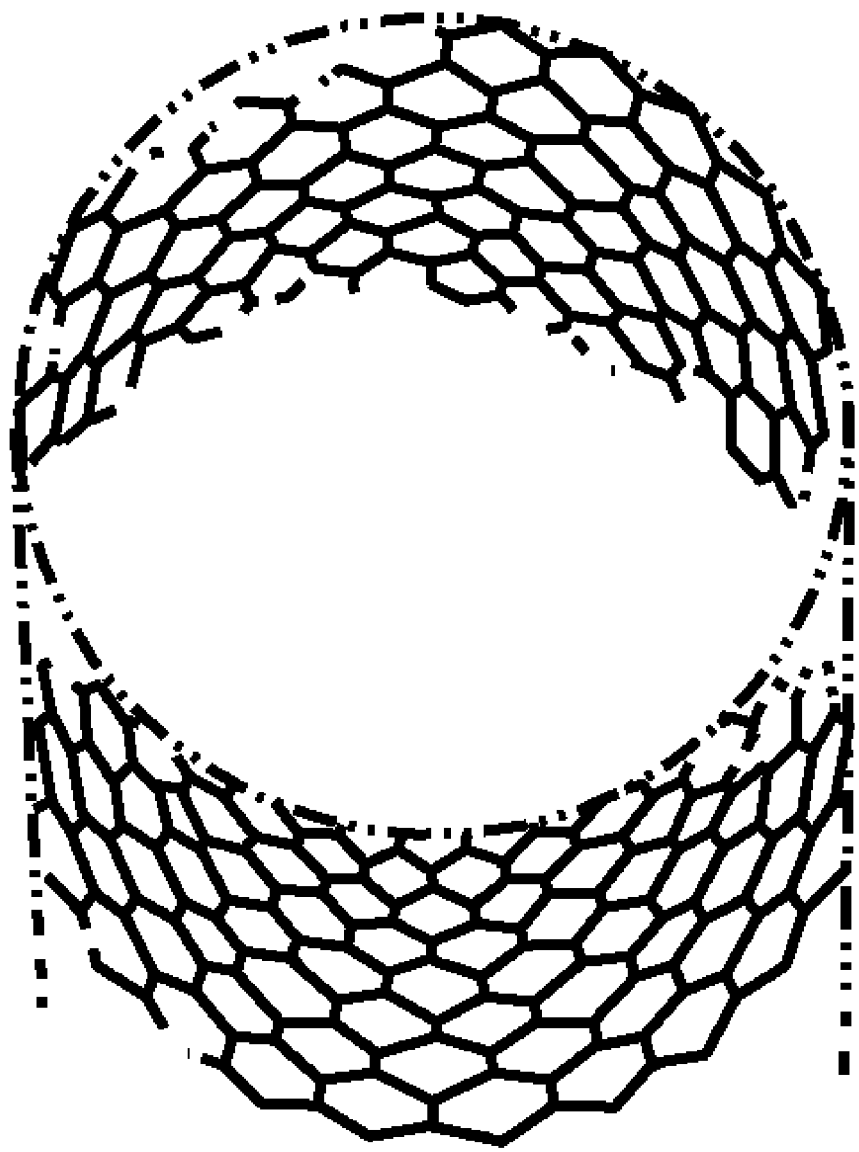
FIG. 2 is an illustration of a carbon nanotube as seen at the molecular level.

FIG. 2 is an illustration of a threadlike macromolecule, or carbon nanotube, as seen at the molecular level. Because of the way the carbon molecules bond to one another, when formed as a carbon nanotube as illustrated, a structure is formed which is stable and strong. As shown, the atoms arrange themselves in hexagonal rings which form into a seamless cylinder, resulting in a litz-like perforated structure that has very high electrical conductivity.

Figure 3:
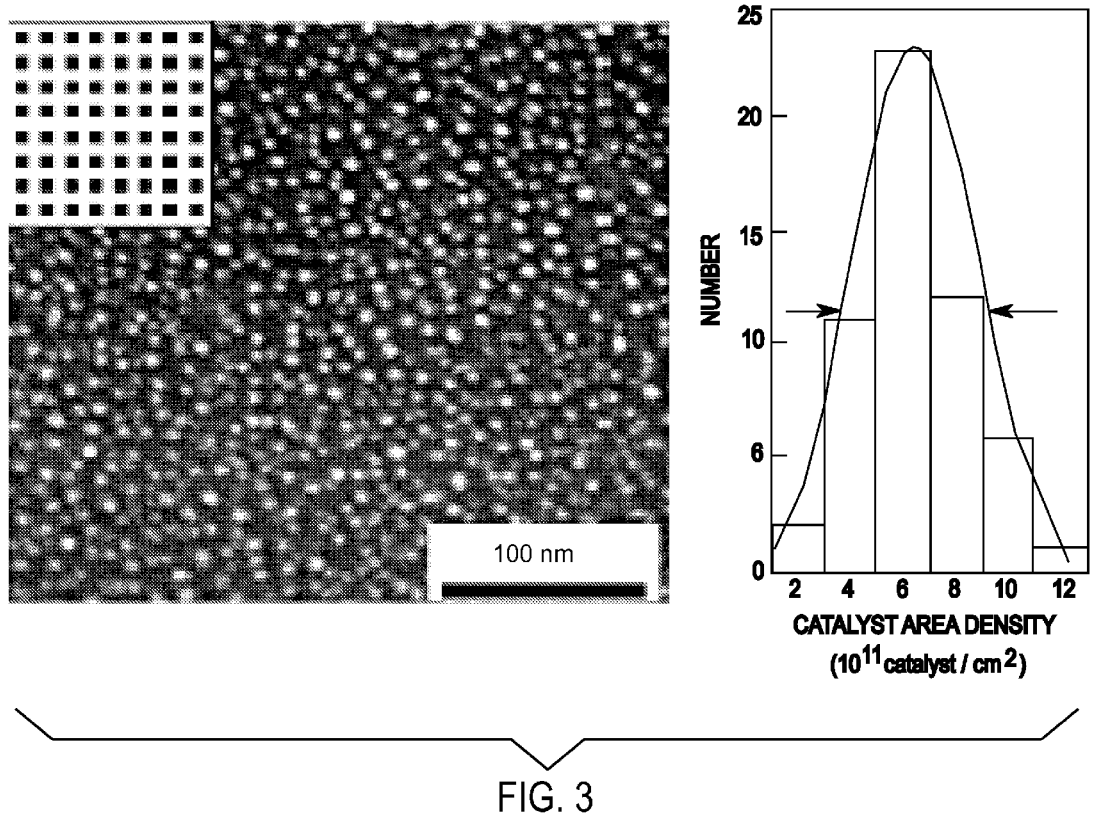
FIG. 3 shows a catalyst sputtered or evaporated and annealed at high temperature.
Figure 4:
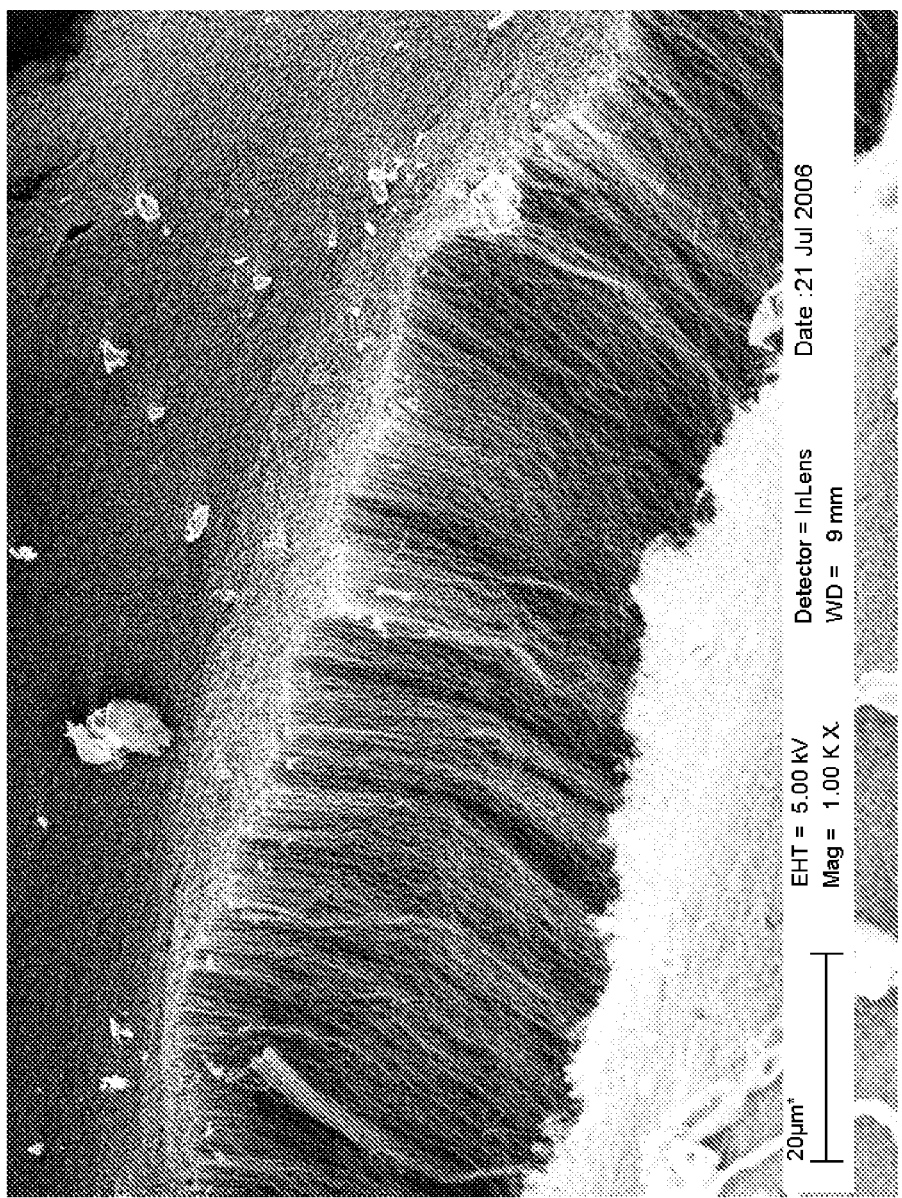
FIG. 4 shows carbon nanotubes in their as-grown state.

A metal thin film catalyst improves the process of carbon nanotube formation. By annealing sputtered or evaporated metal thin films at high temperature, carbon nanotubes can be grown with a very high area density to lengths of 3 mm. FIG. 3 shows a catalyst area density that can be achieved according to the present invention. FIG. 4 shows the resulting growth of very high density nanotubes obtained with the density achieved for laying out a catalyst as shown in FIG. 3.

Typically, the catalyst is a single element transition metal such as Fe. The catalyst may also include a co-catalyst such as Mo or Al. The catalyst and co-catalysts may be deposited sequentially or may be simultaneously deposited on a substrate. In a preferred embodiment the substrate is an organic material such as epoxy. Alternatively, it is contemplated that the substrate may be a ceramic, a glass, or a polymer such as a polyimide, an aramid, a fluorocarbon, and a polyester. The co-catalysts lower the eutectic point of the resulting binary or tertiary alloy. A thin catalyst film of around 1 nm in thickness is deposited on the substrate. After heating the catalyst film to a set temperature that ranges from 500-900 C, the catalyst film forms into islands. Hydrocarbon gases, such as $CH_4$, $C_2H_2$, and the like, are thereby introduced to the islands. The hydrocarbon gasses decompose at the catalyst islands, nucleating the growth of carbon nanotubes.

The carbon nanotubes may be removed from the base substrate and formed into the shape of an inductor. The vertical film can be made readily into a horizontally aligned film using a roller. The carbon nanotube adhesion to the base substrate is weak so the whole film can be removed physically by sliding a blade at the carbon nanotube/substrate interface to form a conductive carbon nanotube conductor. The carbon nanotubes may be then be adhered to a substrate using, for instance, an epoxy or other adhesive. The carbon nanotubes may be made into the shape of an inductor, by using catalyst islands that are first patterned using standard lithography and etch techniques followed by the carbon nanotube growth procedure as described above. As long as the length of the carbon nanotubes is large (greater than 1 mm), the carbon nanotubes can be aligned in the direction of the current flow. Forming the substrate into the shape of an inductor allows the carbon nanotubes to be grown directly on the substrate, and, when growth of the carbon nanotubes is complete, the inductor may be placed into service.

FIG. 5 shows an inductor 70 in accordance with an embodiment of the present invention. Electrical conductor 72 is formed into a coil 74 and includes a first end 76 and a second end 78. Coil 74 comprises a plurality carbon nanotubes 80 mounted on a substrate 81. The plurality of carbon nanotubes 80 have a conductor diameter 82, and are wound into a major coil diameter 84. Coil 74 serves to concentrate magnetic flux which is induced about the conductor 72 when an electrical current is passed therethrough. Electrical conductor 72 is formed from a plurality of carbon nanotubes oriented such that each carbon nanotube lies substantially parallel with a desired direction of current flow.

Figures 6, 7:
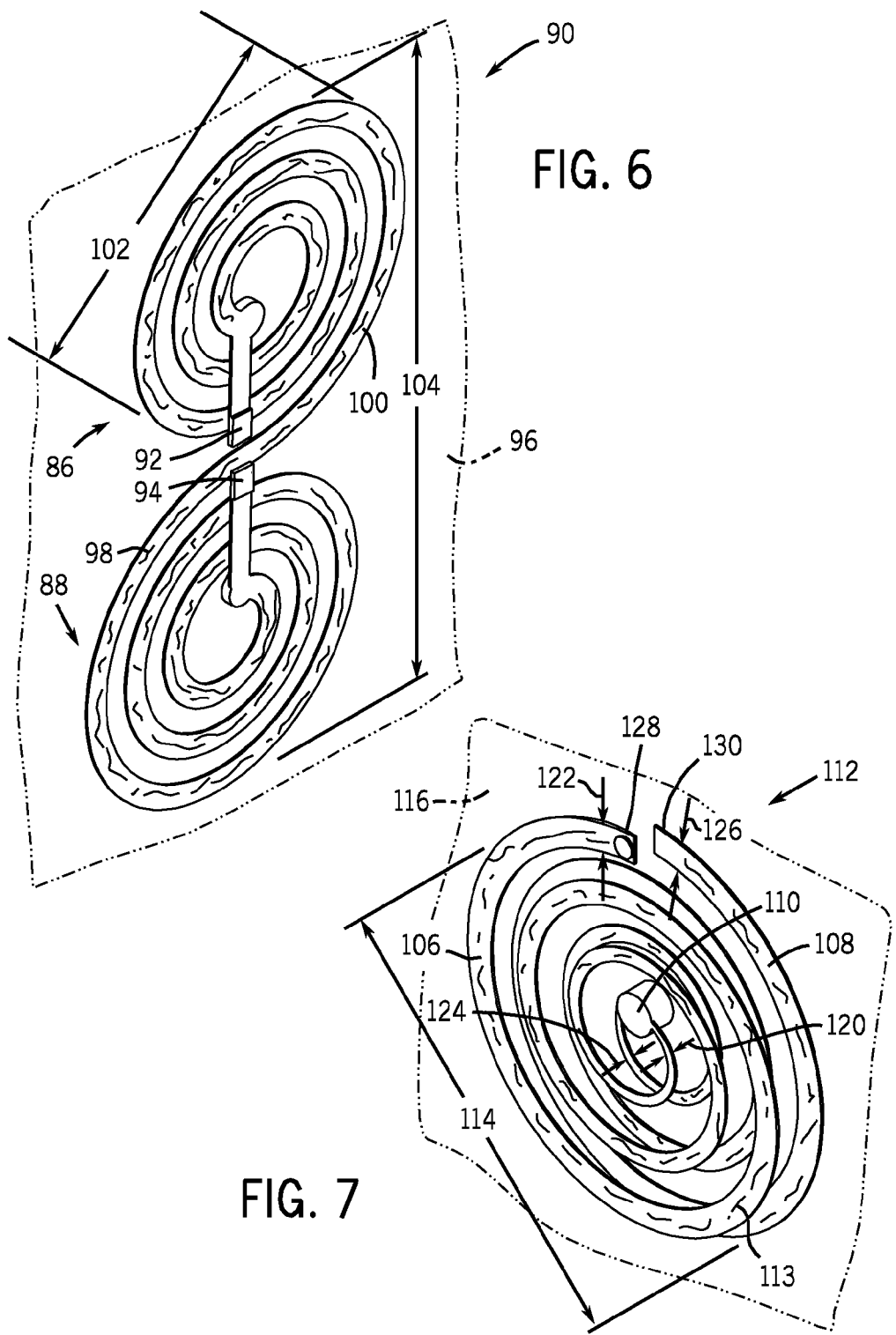
FIG. 6 shows a twin-spiral design of an inductor in accordance with an embodiment of the present invention.
FIG. 7 shows a taper spiral design of an inductor in accordance with an embodiment of the present invention.

FIG. 6 illustrates a twin spiral inductor 90 in accordance with an embodiment of the present invention. Inductor 90 includes a carbon nanotube conductor 100 constructed of a plurality of nanotubes 98 positioned adjacent to each other and oriented in a direction of desired current flow. Inductor 90 includes a first spiral 86 spirally wound in a first orientation and a second spiral 88 spirally wound in a second orientation opposite the first orientation. Inductor 90 includes a first connection terminal 92 and a second connection terminal 94 for electrical connection to an electrical circuit. Inductor 90 is mounted on a substrate 96.

Simulation results of the twin spiral carbon nanotube inductor 90 of FIG. 6 having a coil diameter 102 of 8.08 mm and a total inductor length 104 of 14.45 mm, show that the twin spiral carbon nanotube inductor 90 has an inductance of 60.6 nH, an electrical resistance of 131.9 mΩ at 50 MHz, and a Q factor of 144, when using a bulk electrical conductivity that is 2.5× that of copper. Simulation results of a twin spiral copper inductor formed into the same dimensions as the twin spiral carbon nanotube inductor 90 simulated above show that the twin spiral copper inductor has a Q factor of 91, which is 37% less than the Q factor of the twin spiral carbon nanotube inductor 90.

FIG. 7 illustrates a tapered spiral inductor 112 in accordance with another embodiment of the present invention. Inductor 112 includes a plurality of carbon nanotubes 113 mounted on a substrate 116 having a first spiral 106 and a second spiral 108 connected to an inductor center 110 to form inductor 112 with a major diameter 114. First spiral 106 begins at inductor center 110 having a narrow width 120 and increases in width to a final width 122. Likewise, second spiral 108 begins at inductor center 110 having a narrow width 124 and increases in width to a final width 126. A pair of terminals 128, 130 comprise the connection terminals for inductor 112.

Simulation results of the tapered spiral carbon nanotube inductor 112 of FIG. 7 having a major diameter 114 of 7 mm show that the tapered spiral inductor 112 has an inductance of 108 nH, an electrical resistance of 200 mΩ at 50 MHz, and a Q factor of 170, when using a bulk electrical conductivity that is 2.5× that of copper. Simulation results of a copper twin spiral inductor formed into the same dimensions as the carbon nanotube tapered spiral inductor 112 simulated above show that the copper tapered spiral inductor has a Q factor of 108, which is 36% less than the Q factor of the tapered spiral carbon nanotube inductor 112.

FIG. 8 illustrates a rolled design inductor 132 in accordance with another embodiment of the present invention. Inductor 132 includes a plurality of nanotubes 133 formed on a substrate 134 and formed into a roll having a major diameter 140. A pair of terminals 136, 138 comprise connection terminals for inductor 132.

Simulation results of the rolled carbon nanotube inductor 132 of FIG. 8 having a major diameter 140 of 5.4 mm show that the rolled inductor 132 has an inductance of 490 nH, an electrical resistance of 960 mΩ at 50 MHz, and a Q factor of 161, when using a bulk electrical conductivity that is 2.5× that of copper. Simulation results of a rolled copper inductor formed into the same dimensions as the carbon nanotube rolled inductor 132 simulated above show that the rolled copper inductor has a Q factor of 102, which is 37% less than the Q factor of the rolled carbon nanotube inductor 132.

FIG. 9 shows a cutaway view of the inductor of FIG. 8 mounted on a substrate. Nanotubes 133 are positioned on substrate 134 and rolled in accordance with FIG. 8.

Figure 10:
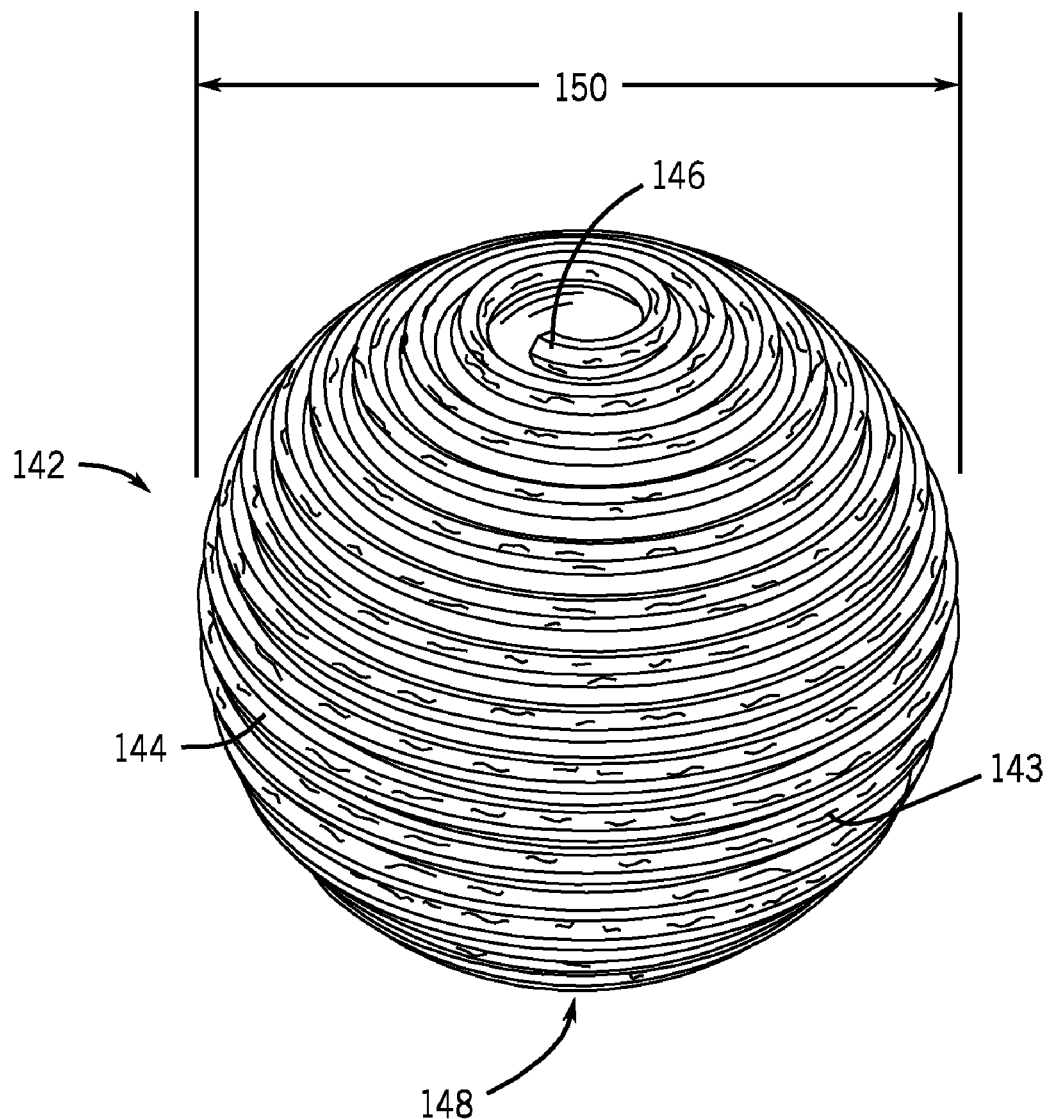
FIG. 10 shows a spherical coil design of an inductor in accordance with an embodiment of the present invention.

FIG. 10 illustrates a spherical coil design of inductor 142 in accordance with yet another embodiment of the present invention. Inductor 142 includes a plurality of nanotubes 143 formed on substantially spherical substrate and formed into a sphere, having a first terminal 146 and a second terminal 148 and having major diameter 150. Terminals 146, 148 comprise connection terminals for inductor 142.

Simulation results of the spherical carbon nanotube inductor 142 of FIG. 10 having a major diameter 150 of 8.2 mm show that the spherical design of inductor 142 made of carbon nanotubes has an inductance of 710 nH, an electrical resistance of 989 mΩ at 50 MHz, and a Q factor of 225, when using a bulk electrical conductivity that is 2.5× that of copper. Simulation results of a spherical copper inductor formed into the same dimensions as the carbon nanotube spherical coil inductor 142 simulated above show that the spherical copper inductor has a Q factor of 143, which is 36% less than the Q factor of the spherical carbon nanotube inductor 142.

Alternate inductor designs may be considered as well and are not limited to the designs as illustrated in FIGS. 6-10

The present invention provides improved inductor designs using carbon nanotubes in RF circuits that can benefit from an inductor having a high Q factor. The RF circuits include RF receivers and RF transmitters wherein increased functional density is desired for diagnostic imaging systems such as high channel count MR and multi-slice CT imaging systems.

In accordance with one embodiment of the invention, an inductor comprises an electrical conductor wound in a magnetic flux concentrating pattern, the electrical conductor comprising a plurality of carbon nanotubes substantially aligned with an axis along a center of the electrical conductor.

The present invention is also direct to a method of fabricating an inductor that includes the steps of providing a plurality of threadlike molecules substantially axially aligned along a common axis, and winding the plurality of carbon nanotubes in a magnetic flux concentrating pattern.

The present invention is also directed to an MRI apparatus that includes a magnetic resonance imaging (MRI) system having a plurality of gradient coils positioned about a bore of a magnet. The gradient coils impress spatially dependent changes to a polarizing magnetic field, and an RF transceiver system and an RF switch are controlled by a pulse module to collect RF signals from an array of RF receive coils to acquire MR images. A plurality of carbon nanotube inductors are electrically connected to the array of RF receive coils. Each carbon nanotube inductor is wound in a pattern to concentrate magnetic flux and comprises a plurality of carbon nanotubes substantially aligned with each other.

The present invention has been described in terms of the preferred embodiment, and it is recognized that equivalents, alternatives, and modifications, aside from those expressly stated, are possible and within the scope of the appending claims.

What is claimed is:

1. An inductor comprising an electrical conductor wound in a magnetic flux concentrating pattern, the electrical conductor comprising:
   a substrate formed into a shape of the inductor; and
   a plurality of carbon nanotubes substantially aligned with an axis along a center of the electrical conductor,
   wherein the plurality of carbon nanotubes are grown on the substrate.

2. The inductor of claim 1 wherein the carbon nanotubes form hollow litz-like perforated structures.

3. The inductor of claim 1 wherein the plurality of carbon nanotubes is a plurality of threadlike macromolecules.

4. The inductor of claim 1 wherein the magnetic flux concentrating pattern comprises a coil.

5. The inductor of claim 1 wherein the electrical conductor is embedded in the substrate.

6. The inductor of claim 1 wherein the substrate is a material comprising one of a ceramic and a glass.

7. The inductor of claim 1 wherein the substrate is an organic material.

8. The inductor of claim 7 wherein the organic material comprises an epoxy resin.

9. The inductor of claim 1 wherein the substrate is a polymer.

10. The inductor of claim 9 wherein the polymer comprises one of a polyimide, an aramid, a fluorocarbon, and a polyester.

11. The inductor of claim 1 wherein the inductor is attached to an RF electrical circuit used in a diagnostic medical imaging system.

12. The inductor of claim 11 wherein the diagnostic imaging device is a device comprising one of a CT device, an MRI device, an x-ray device, and an ultrasound device.

13. The inductor of claim 1 wherein the inductor is attached to an electrical circuit used in at least one of a radio, a cell phone, or a wireless fidelity (WiFi) network.

14. An inductor comprising an electrical conductor wound in a magnetic flux concentrating pattern, the electrical conductor comprising an inductor substrate;
   a film comprising plurality of carbon nanotubes substantially aligned with a current flow direction, wherein the film is a conductive carbon nanotube conductor, said film being devoid of a base substrate;
   wherein the film is attached to the substrate by an adhesive.

15. The inductor of claim 14, wherein the inductor substrate comprises ceramic, glass, polymer, and combinations thereof.

16. The inductor of claim 14, wherein the film is configured in the magnetic flux concentrating pattern prior to being attached to the substrate.

17. The inductor of claim 14, wherein the substrate and attached film are configured in the flux concentrating pattern.

* * * * *